United States Patent
Feldner et al.

(10) Patent No.: US 6,753,236 B2
(45) Date of Patent: Jun. 22, 2004

(54) METHOD FOR PLANARIZING AN ISOLATING LAYER

(75) Inventors: Klaus Feldner, Dresden (DE); Werner Graf, Dresden (DE); Albrecht Kieslich, Radebeul (DE); Hermann Sachse, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/233,686

(22) Filed: Sep. 3, 2002

(65) Prior Publication Data

US 2003/0045105 A1 Mar. 6, 2003

(30) Foreign Application Priority Data

Aug. 31, 2001 (DE) .......................... 101 42 595

(51) Int. Cl.[7] .............................................. H01L 21/76
(52) U.S. Cl. ........................................ 438/401; 438/427
(58) Field of Search ................................ 438/427, 401, 438/424, 638

(56) References Cited

U.S. PATENT DOCUMENTS

| | | | | |
|---|---|---|---|---|
| 4,352,724 A | * | 10/1982 | Sugishima et al. | 204/192 E |
| 5,683,932 A | * | 11/1997 | Bashir et al. | 438/424 |
| 5,946,591 A | | 8/1999 | Ashigaki et al. | |
| 5,958,795 A | | 9/1999 | Chen et al. | |
| 6,124,183 A | * | 9/2000 | Karlsson et al. | 438/427 |
| 6,130,168 A | | 10/2000 | Chu et al. | |
| 6,159,822 A | * | 12/2000 | Yang et al. | 438/427 |
| 6,303,460 B1 | * | 10/2001 | Imamatsu | 438/401 |

OTHER PUBLICATIONS

Stanley Wolf Silicon Processing for the VSLI Era vol. 1 Lattice Press 1986 pp. 194 and 541.*

* cited by examiner

Primary Examiner—Carl Whitehead, Jr.
Assistant Examiner—David S Blum
(74) Attorney, Agent, or Firm—Laurence A. Greenberg; Werner H. Stemer; Ralph E. Locher

(57) ABSTRACT

A method for planarizing the surface of an isolating layer that is deposited on a semiconductor body is described. Zones where the isolating layer has a low level are covered with a block mask in order to be able to selectively etch zones of the isolating layer with a higher level.

19 Claims, 4 Drawing Sheets

N2 ion Implantation

Different Structure Heights

METHOD FOR PLANARIZING AN ISOLATING LAYER

BACKGROUND OF THE INVENTION

Field of the Invention

The present invention relates to a method for planarizing a surface of an isolating layer that is deposited on a semiconductor body of an integrated semiconductor circuit configuration and whose surface lies on a higher level relative to the semiconductor body in first regions of the semiconductor circuit configuration than in second regions of the semiconductor circuit configuration.

In the fabrication of integrated circuits such as semiconductor memories, their surfaces must be planarized after certain processing steps before further processing steps are initiated. The planarizing usually occurs in a chemical mechanical polishing (CMP) step. An example of this is the masking of the active region (active area (AA) mask) with the subsequent isolation trench (IS) etching of this region in DRAM fabrication. After the AA masking the inactive regions are filled with silicon dioxide, what is known as a shallow trench isolation (STI) oxide, for electrical isolation and then planarized by a CMP step. It is known that the desired planarity cannot be achieved by a CMP step and specified CMP tools.

SUMMARY OF THE INVENTION

It is accordingly an object of the invention to provide a method for planarizing an isolating layer which overcomes the above-mentioned disadvantages of the prior art methods of this general type, with which it is possible to minimize levels between individual regions of the isolating layer and between the isolating layer and a top edge of silicon.

With the foregoing and other objects in view there is provided, in accordance with the invention, a method for planarizing a surface of an isolating layer deposited on a semiconductor body of an integrated semiconductor circuit configuration. The surface lies at a higher level in first zones of the integrated semiconductor circuit configuration than in second zones of the integrated semiconductor circuit configuration. The method includes the steps of covering the second zones with a block mask, and etching the isolating layer in the first zones.

The object is inventively achieved with a method of the above type by first covering the second zones with a block mask, and then subjecting the isolating layer to an etching process in the first zones.

In an advantageous development of the invention, the isolating layer is an STI layer formed of silicon dioxide. The level of the STI layer can be at least 10 nm higher in the first zones than in the second zones. The first zones can advantageously form a cell field, while a logic configuration is placed in the second zones.

Dry or wet chemical etching can be applied for the etching process with which the isolating layer in the first zones is etched back. The etching process can be performed before or after the removal of a silicon nitride layer that covers the semiconductor body outside the isolating layer.

A suitable material can be employed for the block mask, such as a resist, a varnish, etc.

What is essential to the inventive method is that zones with a lower level, such as a logic area or a thin oxide zone, are first covered with a block mask. The regions with a higher level, such as an active region like a cell field or a thick oxide zone, are then etched back by a dry or wet chemical process. The etching can be performed before or after the removal of a nitride layer or some other isolating layer that may still be present in the active zone or cell field, i.e. before or after a nitride strip. A $CHF_3/CF_4$ oxide etching chemistry is preferably utilized for the etching for which a reactive ion etching (RIE) can be utilized.

With the inventive method, the planarization can be appreciably improved after a CMP step by dry and wet chemical etching with the aid of the block mask. The level in the individual zones can be reduced by the selective etching with the aid of the block mask, so that the planarity comes optimally close to the desired planarity for regions with low coverage densities, such as in the logic area, and for regions with high coverage density, such as in the cell field. If necessary, it is possible to remove the block mask from the second zones after an etching process in the first zones and to perform an additional dry or wet chemical etching procedure in the second zones, potentially together with the first zones.

Other features which are considered as characteristic for the invention are set forth in the appended claims.

Although the invention is illustrated and described herein as embodied in a method for planarizing an isolating layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 7:
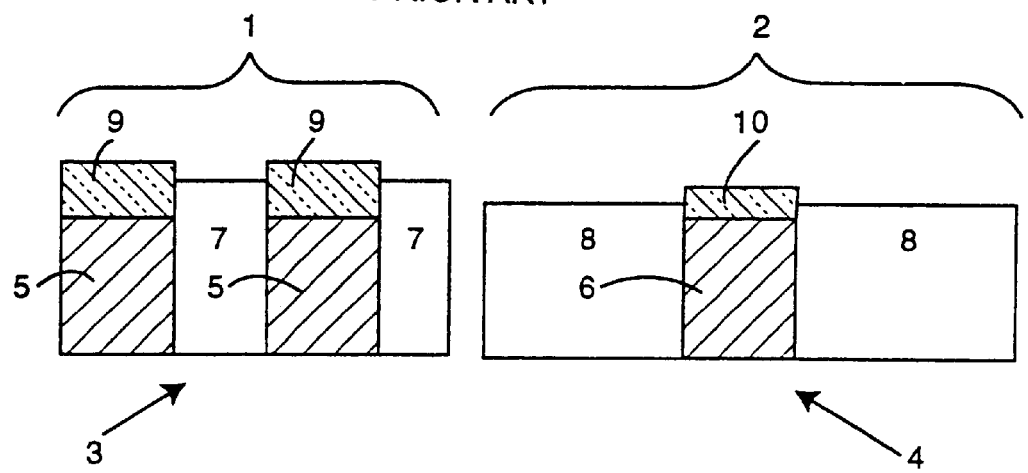
FIGS. 7 and 8 are sectional views illustrating a first method according the prior art.

Referring now to the figures of the drawing in detail and first, particularly, to FIG. 7 thereof, there is shown a result reached at the end of chemical mechanical polishing (CMP) step for a region 1 and a logic area 2 of a semiconductor body 3, 4. The semiconductor body 3, 4 contains a chip and is represented in divided form for the purpose of illustrating the difference between the region 1 and the logic area 2.

In the region 1 and the logic area 2 in which circuit elements can be realized, individual active regions 5, 6, are separated by STI regions 7, 8, which are formed from silicon dioxide for example.

After the CMP step, the individual active zones 5 in the region 1, for instance the memory cell field, are still covered by a silicon nitride layer 9 that functions as a CMP stop layer. The same is true of the logic area 2 with respect to a silicon nitride layer 10 on the active zone 6. The thickness of the residual silicon nitride layers 9, 10 is now dependent on the local coverage density. The layer thickness of the silicon nitride layer 9 in the region 1 is greater than the thickness of the silicon nitride layer 10 in the logic area 2. Besides this, in the region 1 the STI zones 7 are located between the active zones 5, with their top side lying at least 10 nm above the top edge of the silicon of the active zones 5, as can be seen in FIG. 7, left-hand side.

In other words, the chip containing the integrated semiconductor circuit configuration has level differences on its surface even after the CMP step.

Figure 8:
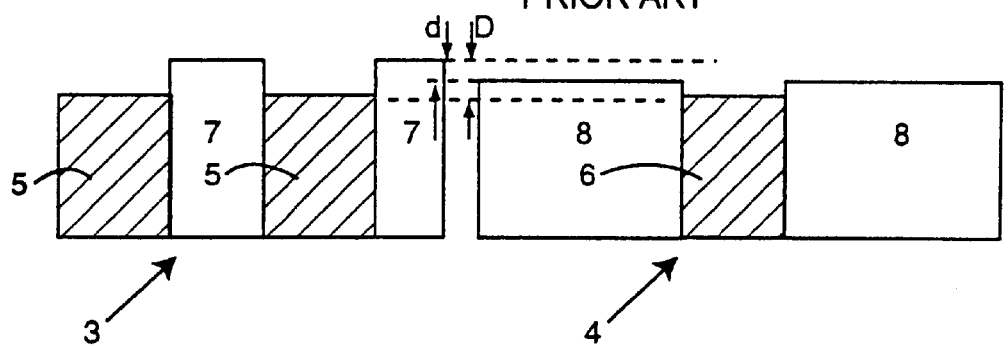

The next step in processing is the stripping of the silicon nitride layers 9, 10, so that the configuration represented in FIG. 8 remains. The level difference between the top edge of the silicon of the active zones 5, 6 and the surface of the STI zones 7 is referenced D, and the level difference between the STI zones 7 and 8 of the active region 1 and the logic area 2, respectively, is referenced d. The level differences D and d degrade the subsequent processing steps, which may include well implantations and gate oxide formation as well as gate-conductor layer structuring.

Figure 9:
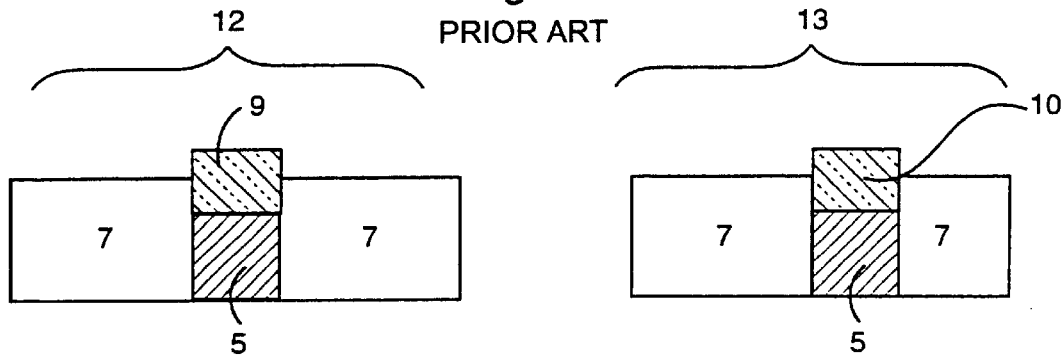
FIGS. 9 to 12 are sectional views illustrating a second method according to the prior art.
Figure 10:
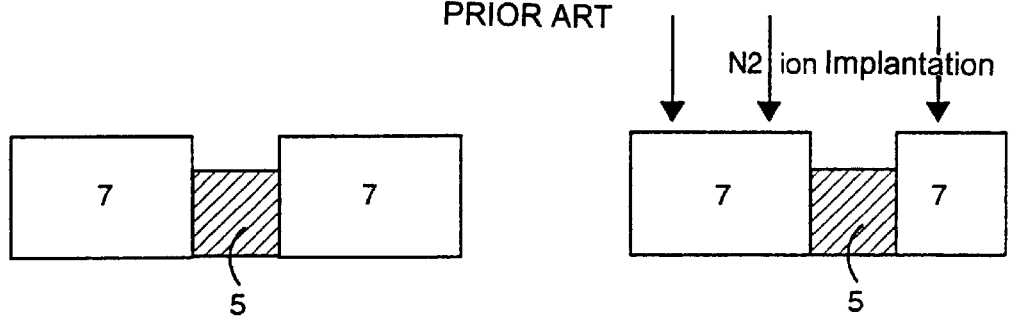
Figure 11:
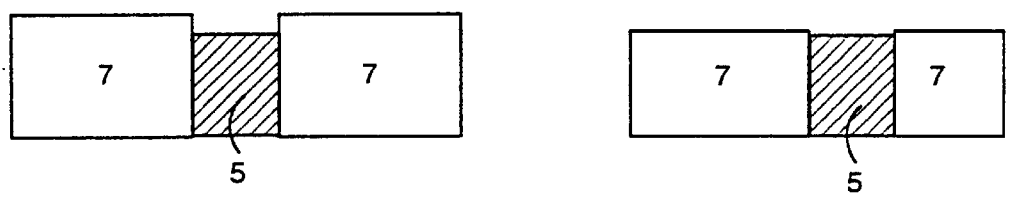
Figure 12:
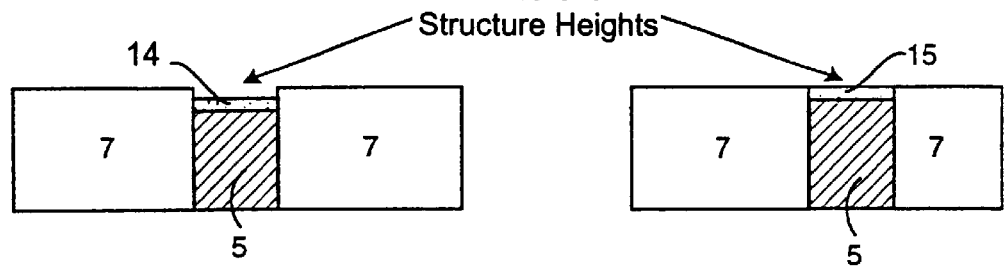

FIGS. 9 to 12 illustrate another existing dual gate oxide (GOX) process for a zone 12 with a thick oxide and a zone 13 with a thin oxide. FIG. 9 represents a chip after a CMP step. FIG. 10 represents the chip after an $N_2$ ion implantation and a silicon nitride removal in which the silicon nitride layers 9, 10 on the active zones 5 were eroded or striped. FIG. 11 represents the chip following a sacrifice oxide (SAC oxide) striping in which the STI zones 7 were thinned. FIG. 12 shows the chip after the depositing of gate oxide layers 14, 15 with different layer thicknesses, namely a thick oxide layer 14 in the zone 12 and a thin oxide layer 15 in zone 13. Different levels are visible for the oxide layers 14, 15 to the STI zones 7. The reason for this is that the silicon dioxide which forms the STI zones 7 is etched differently by wet etching depending on whether or not it has undergone an $N_2$ ion implantation. Implanted zones are etched more rapidly than non-implanted zones during the sacrifice oxide strip.

It has been shown that the desired planarity cannot be achieved by a CMP step and specified CMP tools.

Figure 1:
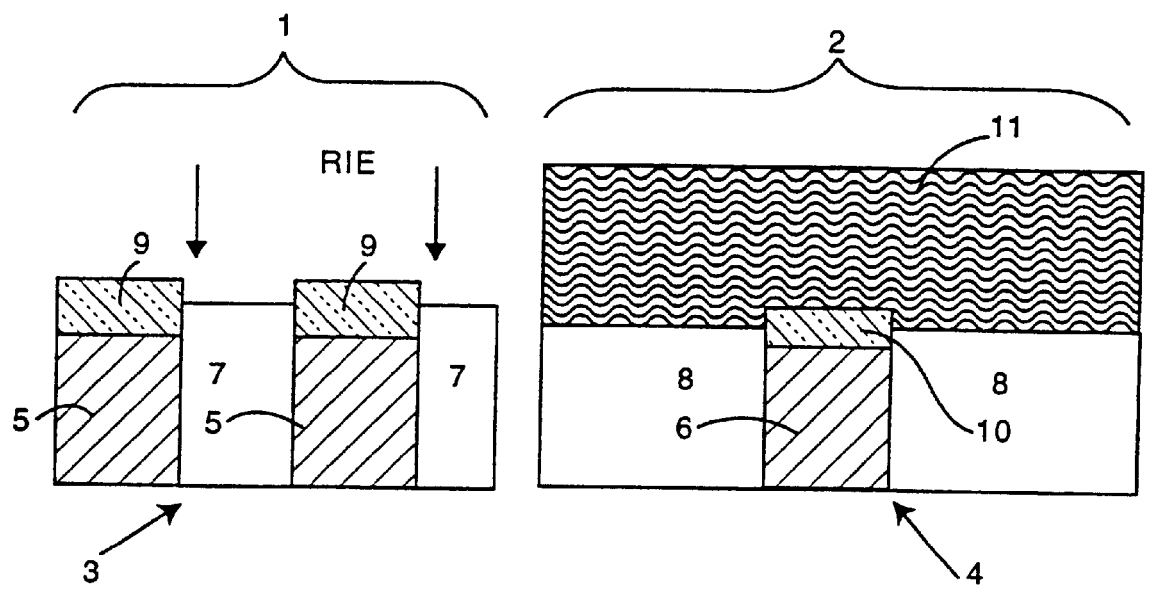
FIGS. 1 and 2 are diagrammatic, sectional views illustrating a first exemplifying embodiment of a method according to the invention.

Like FIG. 7, FIG. 1 represents a section through the region 1 and the logic area 2 of the semiconductor body 3 and 4 with the active zones 5 and 6 as well as the STI zones 7 and 8 after a chemical-mechanical polishing process. In order to achieve a reduction of the levels D and d between the top edges of the STI zones 7 in the region 1 and the top edge of the silicon in the active zones 5, 6, and between the top edges of the active zones 7 and 8, respectively, (FIG. 8), a block mask 11 formed of varnish or a resist material or some other selectively etchable substance is inventively deposited on the logic area 2. The region 1 is then subjected to dry or wet chemical reactive ion etching (RIE), in order to etch back the top side of the STI zones 7 until they have achieved the same level as the STI zones 8 in the logic area 2. The RIE etch-back can be performed before or after the removal of the silicon nitride layer 9.

Figure 2:
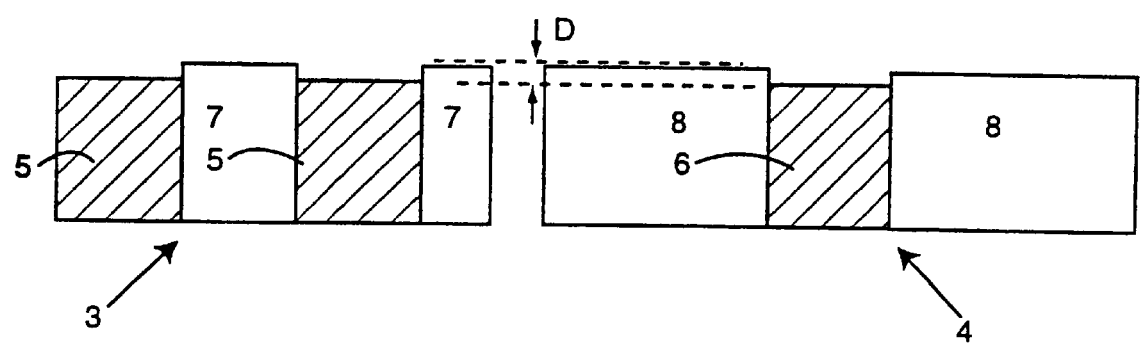
Figure 3:
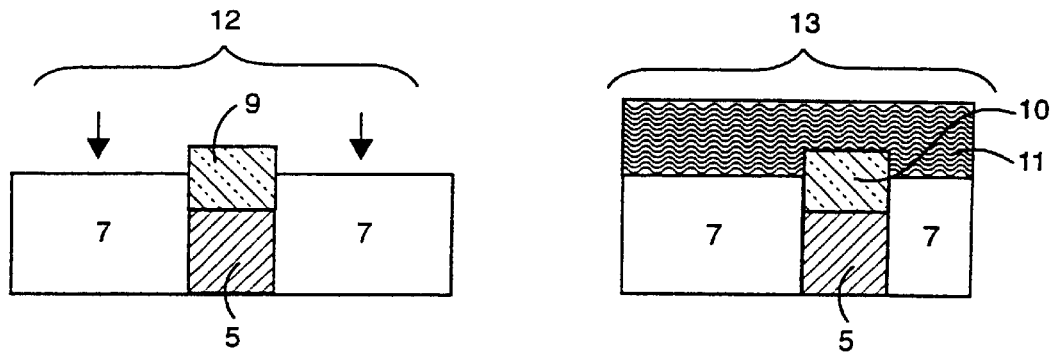
FIGS. 3 to 6 are sectional views illustrating a second exemplifying embodiment of the inventive method.
Figure 4:
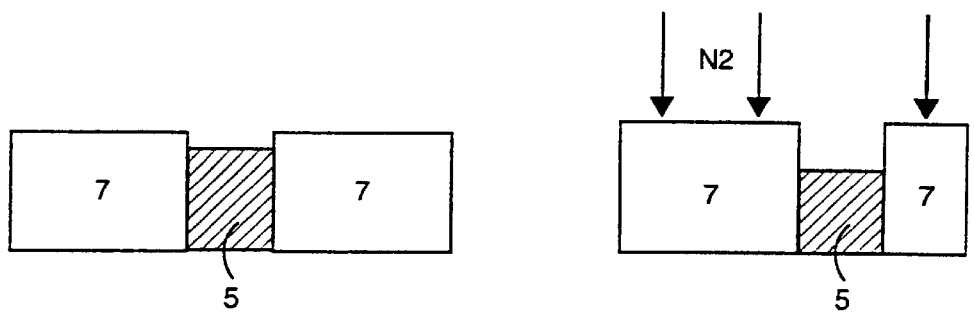
Figure 5:
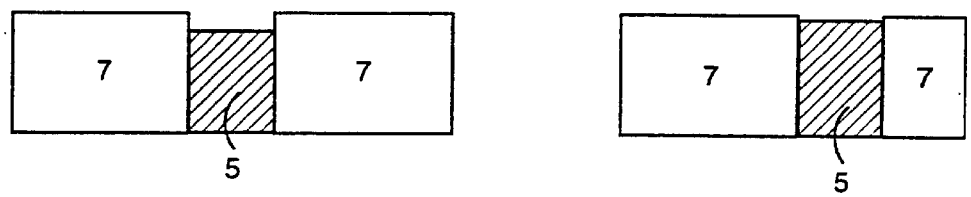

As emerges from the schematic representation in FIG. 2, the level d can be brought down practically to zero. Besides this, a substantial reduction of the level D is also possible.

Figure 6:
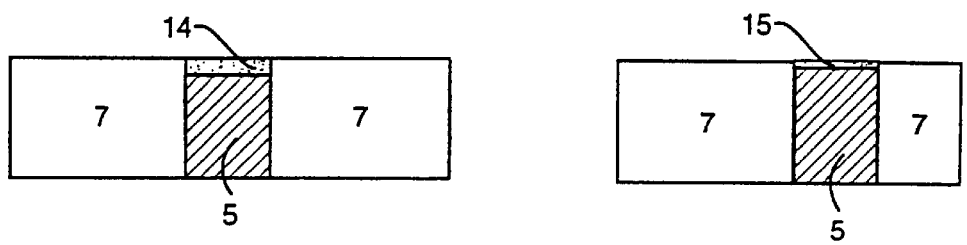

FIGS. 3 to 6 illustrate how to prevent different levels in the zone 12 with the thick oxide and the zone 13 with the thin oxide with the inventive method. Namely, the block mask 11 is deposited on the thin oxide zone 13 (FIGS. 3 and 9), so that the STI zones 7 formed of silicon-dioxide can be etched back in the thick oxide-zone 12 ("oxide etch-back"). This makes it possible to set levels between the active zones 5 and the STI zones 7 such that the thick oxide layer 14 is planar with the thin oxide layer 15 after the stripping of the sacrifice oxide (FIGS. 6 and 12). Different etch rates in implanted and non-implanted zones can thus be compensated. Of course, this compensation can also be achieved when height (level) differences are produced by other causes. The steps of FIGS. 3 to 6 correspond to the steps of FIGS. 9 to 12, respectively.

We claim:

1. A method for equalizing different levels on a surface of an isolating layer deposited on a semiconductor body of an integrated semiconductor circuit configuration, the surface lying at a higher level in first zones of the integrated semiconductor circuit configuration than in second zones of the integrated semiconductor circuit configuration, which comprises the steps of:

providing active zones separated by a shallow trench insulation (STI) layer configured as the isolating layer to the surface on the semiconductor body in each of the first zones and the second zones;

forming a first level and a second level between an upper edge of the active zones and an upper edge of the STI layer in each of the first zones and the second zones, the first level of the first zones being greater than the corresponding second level of the second zones;

covering the second zones with a block mask; and etching the isolating layer in the first zones until achieving an equalization between the first level and the second level.

2. The method according to claim 1, which comprises forming the isolating layer as a shallow trench isolation layer.

3. The method according to claim 2, which comprises utilizing a silicon dioxide layer as the shallow trench isolation layer.

4. The method according to claim 2, which comprises forming a level of the shallow trench isolation layer at least 10 nm higher in the first zones than in the second zones.

5. The method according to claim 1, which comprises:

forming the first zones of the integrated semiconductor memory configuration for use as a cell field; and forming the second zones of the integrated semiconductor memory configuration for use as a logic area.

6. The method according to claim 1, which comprises using thick oxide zones as the first zones, and thin oxide zones as the second zones.

7. The method according to claim 1, which comprises using one of dry chemical reactive ion etching and wet chemical reactive ion etching for the etching.

8. The method according to claim 1, which comprises carrying out the etching one of before and after a removal of a silicon nitride layer covering the semiconductor body outside the isolating layer.

9. The method according to claim 8, which comprises using a $CHF_3/CH_4$ oxide etch chemistry for removing the silicon nitride layer.

10. A method for forming planar thick oxide layers and thin oxide layers on active zones in an integrated semiconductor configuration, which comprises the steps of:

depositing an isolating layer on a semiconductor body, a surface of the active zones in the semiconductor body lying at a different level in first zones than the active zones in second zones of the semiconductor body;

covering the second zones with a block mask to reconcile the different etching speeds between the first zones and the second zones; and etching the isolating layer in the first zones until equalizing the surface level of the isolating layer in the first zones with the surface level of the isolating layer in the second zones of the semiconductor body.

11. The method according to claim 10, which comprises forming the isolating layer as a shallow trench isolation layer.

12. The method according to claim 11, which comprises utilizing a silicon dioxide layer as the shallow trench isolation layer.

13. The method according to claim 11, which comprises forming a level of the shallow trench isolation layer at least 10 nm higher in the first zones than in the second zones.

14. The method according to claim 10, which comprises:
forming the first zones for use as a cell field; and
forming the second zones for use as a logic area.

15. The method according to claim 10, which comprises using thick oxide zones as the first zones, and thin oxide zones as the second zones.

16. The method according to claim 10, which comprises using one of dry chemical reactive ion etching and wet chemical reactive ion etching for the etching.

17. The method according to claim 10, which comprises:
applying a silicon nitride layer covering the semiconductor body outside an area of the isolating layer before performing the covering step; and
carrying out the etching one of before and after a removal of a silicon nitride layer covering the semiconductor body outside the isolating layer.

18. The method according to claim 17, which comprises using a $CHF_3/CF_4$ etch chemistry for removing the silicon nitride layer.

19. The method according to claim 11, which comprises:

separating active zones in the thin oxide zones and the thick oxide zones by the shallow trench isolation layer;

forming a larger level between the upper edge of the shallow trench isolation layer and the active zones in the thick oxide zones than a corresponding smaller level formed between the upper edge of the shallow trench isolation layer and the active zones in the thin oxide zones;

implanting the thin oxide zones to increase the etching speed;

thinning the shallow trench isolation layer more in the thick oxide zones than in the thin oxide zones; and etching until the larger level and smaller level are equalized to form thick oxide layers and thin oxide layers.

* * * * *